United States Patent
Vystavěl et al.

(10) Patent No.: US 11,017,980 B2
(45) Date of Patent: May 25, 2021

(54) METHOD OF MANIPULATING A SAMPLE IN AN EVACUATED CHAMBER OF A CHARGED PARTICLE APPARATUS

(71) Applicant: FEI Company, Hillsboro, OR (US)

(72) Inventors: Tomáš Vystavěl, Brno (CZ); Petronella Catharina Maria Baken, Eindhoven (NL); Ernst Jan Ruben Vesseur, Utrecht (NL); Pavel Poloucek, Brno (CZ)

(73) Assignee: FEI Company, Hillsboro, OR (US)

( * ) Notice: Subject to any disclaimer, the term of this patent is extended or adjusted under 35 U.S.C. 154(b) by 974 days.

(21) Appl. No.: 15/099,453

(22) Filed: Apr. 14, 2016

(65) Prior Publication Data
US 2016/0307727 A1  Oct. 20, 2016

(30) Foreign Application Priority Data

Apr. 15, 2015 (EP) .................................. 15163671

(51) Int. Cl.
*H01J 37/20* (2006.01)
*H01J 37/28* (2006.01)
*H01J 37/317* (2006.01)

(52) U.S. Cl.
CPC .............. *H01J 37/20* (2013.01); *H01J 37/28* (2013.01); *H01J 37/317* (2013.01);
(Continued)

(58) Field of Classification Search
CPC .......... H01J 37/20; H01J 37/28; H01J 37/317; H01J 37/3023; H01J 2237/26;
(Continued)

(56) References Cited

U.S. PATENT DOCUMENTS 6,457,350 B1  10/2002  Mitchell
7,258,901 B1  8/2007  Lee et al.
(Continued)

FOREIGN PATENT DOCUMENTS

CN  101241838 A  8/2008
CN  101609771 A  12/2009
(Continued)

OTHER PUBLICATIONS

Hu, Shihao, et al. "Advanced gecko-foot-mimetic dry adhesives based on carbon nanotubes", Nanoscale, Nov. 6, 2012, pp. 475-486, vol. 5, The Royal Society of Chemistry 2013.
(Continued)

*Primary Examiner* — David E Smith
*Assistant Examiner* — Hsien C Tsai

(57) ABSTRACT

The invention relates to a method of manipulating a sample in an evacuated chamber of a charged particle apparatus, the method performed in said evacuated chamber, the method including: providing a sample on a first substrate; bringing an extremal end of a manipulator in contact with the sample; attaching the sample to said extremal end, the attaching being a removable attaching; lifting the sample attached to the extremal end of the manipulator from the first substrate and transport the sample to a second substrate; attaching the sample to the second substrate; and detaching the sample from the extremal end of the manipulator. At least one of the steps of attaching the sample being performed solely by bringing the sample into contact with a bundle of carbon nanotubes.

18 Claims, 3 Drawing Sheets

Figure 1A:
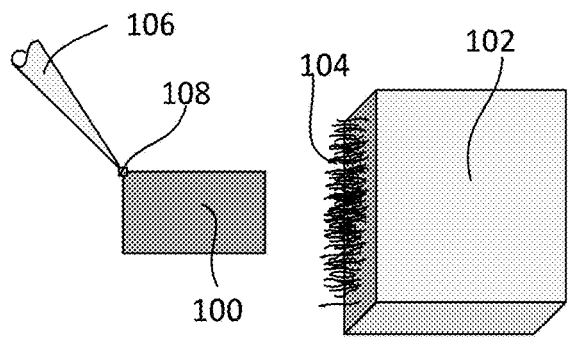

(52) U.S. Cl.
CPC . *H01J 2237/2007* (2013.01); *H01J 2237/208* (2013.01); *H01J 2237/26* (2013.01); *H01J 2237/31745* (2013.01)

(58) Field of Classification Search
CPC .......... H01J 2237/201; H01J 2237/208; H01J 2237/2802; H01J 2237/2007; H01J 2237/31745
See application file for complete search history.

(56) References Cited

U.S. PATENT DOCUMENTS

| | | | |
|---|---|---|---|
| 8,729,469 | B1 | 5/2014 | Schmidt et al. |
| 2003/0094035 | A1 | 5/2003 | Mitchell |
| 2006/0060004 | A1* | 3/2006 | Desrochers ............... G01N 1/22 73/863.71 |
| 2009/0317926 | A1 | 12/2009 | Zhang et al. |
| 2012/0261588 | A1 | 10/2012 | Wei et al. |
| 2014/0373646 | A1* | 12/2014 | Maeno ................. H01J 49/0409 73/864.91 |
| 2016/0181059 | A1 | 6/2016 | Vystavel et al. |

FOREIGN PATENT DOCUMENTS

| | | |
|---|---|---|
| CN | 102737935 A | 10/2012 |
| CN | 104081195 A | 10/2014 |
| EP | 1468437 A2 | 10/2004 |
| EP | 3062329 A1 | 8/2016 |
| JP | 2000162102 A | 6/2000 |
| JP | 2005062130 | 3/2005 |
| JP | 2006073270 | 3/2006 |
| JP | 2006205271 A | 8/2006 |
| JP | 2008122166 A | 5/2008 |
| JP | 2013160587 A | 8/2013 |
| JP | 2013160589 A | 8/2013 |
| JP | 2013221915 A | 10/2013 |
| JP | 2014126470 A | 7/2014 |
| WO | 03028065 A | 4/2003 |

OTHER PUBLICATIONS

Kleindiek Nanotechnik GmbH., Reutlingen, Germany, Retrieved from the Internet Sep. 30, 2016: http://www.kleindiek.com/mgs2-em.html, 2 pages.

* cited by examiner

METHOD OF MANIPULATING A SAMPLE IN AN EVACUATED CHAMBER OF A CHARGED PARTICLE APPARATUS

The invention relates to a method of manipulating a sample in an evacuated chamber of a charged particle apparatus, the method performed in said evacuated chamber, the method comprising:

A step of providing a sample on a first substrate,

A step of bringing an extremal end of a manipulator in contact with the sample,

A step of attaching the sample to said extremal end, the attaching being a removably attaching, A step of lifting the sample attached to the extremal end of the manipulator from the substrate and transport the sample to a second substrate, A step of attaching the sample to the second substrate, A step of detaching the sample from the extremal end of the manipulator, Such a method is known from European patent application EP1468437A2 to Asjes. Asjes describes an electrostatic gripper, in which a fork of at least two electrically conductive elements is capable of exerting an electrostatic force on a sample. Preferably the conductive elements are coated with a thin insulating layer.

By bringing the extremal end of the manipulator (also called the "tip" of the manipulator) in close contact to the sample and then "energizing" the electrostatic fork by applying a voltage difference to the two electrically conductive elements, the sample is bonded to the fork by electrostatic forces.

A disadvantage of the method of Asjes is the unreliable results when handling samples of insulating material, resulting in possible loss of a sample.

Another such method is known from using a MGS2-EM microgripper from Kleindiek Nanotechnik GmbH., Reutlingen, Germany, see: http://www.kleindiek.com/mgs2-em.html. Here a piezo-powered micro-pincer (the extremal end or tip) is used to grip the sample and, after placing it elsewhere, release it again.

A disadvantage is possible mechanical deformation of the sample. Another disadvantage is that the griper must be positioned very precisely, and thus the method of using a mechanical gripper is not a quick method.

It is noted that in the following text the words "extremal end" and "tip" are used interchangeable, meaning the same.

The invention aims to offer a solution to said problems.

To that end the method according to the invention is characterized in that at least one of the steps of attaching the sample is performed solely by bringing the sample into contact with a bundle of carbon nanotubes).

It is noted that the use of CNTs as dry adhesives is proposed in e.g. Shihao Hu et al., "Advanced gecko-foot-mimetic dry adhesives based on carbon nanotubes", Nanoscale, 2013, 5, pp 475-486. Also attaching a single CNT to a work bench in a particle-optical apparatus for the characterization of said single CNT is known from this publication. However, the use of a bundle of CNTs for detachably adhering a sample in a particle-optical apparatus is not disclosed or hinted at.

It is further noted that Japanese Patent Application Number JP2006073270A also disclosed a sample that is attached to a thermally conductive needle, the needle formed from a metal or a carbon nanotube (CNT). However, this application teaches to connect the sample to the CNT using Beam Induced Deposition, so as to have a high thermal conductive connection with the holder.

In an embodiment, the other step of attaching the sample comprises attaching the sample by beam induced deposition from the group of EBID, IBID or LBID.

Here the sample is attached to either the manipulator or the second substrate using BID. Attaching a sample to a manipulator or a second substrate (for example a sample grid or a MEMS heater) using Electron Beam Induced Deposition (EBID), Ion Beam Induced Deposition (IBID) or Laser Beam Induced Deposition (LBID) is known to the skilled artisan.

In another embodiment the sample is attached to the extremal end of the manipulator by EBID, IBID or LBID and attached to the second substrate solely by bringing the sample into contact with a bundle of carbon nanotubes (104, 306).

The method is especially suited to reposition a semiconductor sample, said sample excavated from the first substrate.

Excavating a sample from a first substrate (a wafer) is well-known to the skilled artisan. Such a sample has a typical dimension of 10×10 µm$^2$ and a thickness of between approximately 1 µm (directly after excavation) to approximately 100-20 nm (after so-called 'thinning').

Preferably, the second substrate is a sample carrier for use in a SEM and/or a sample carrier for use in a FIB and/or a sample carrier for use in a TEM and/or a MEMS heater.

Such sample carriers are readily available in many forms, such as half-moon grids, grids with a mesh, holey carbon grids, stubs, etc. Several suppliers, such as SPI Supplies/Structure Probe, Inc., West Chester, USA, are known to make such sample carriers available to the public.

In an embodiment, the second substrate is equipped with a bundle of CNTs and the step of attaching the sample to the second substrate is a step of removably attaching the sample to said bundle of CNTs.

The second substrate can be a sample carrier (for example a TEM grid), or another type of substrate.

In another embodiment, the manipulator is equipped with a bundle of CNTs and the step of attaching the sample to the manipulator is a step of removably attaching the sample to said bundle of CNTs.

In a further embodiment, the bundle of CNTs is attached to the body of the manipulator by EBID, IBID or LBID.

In this embodiment the CNTs are replaceable, or the CNTs can be replaced by other means, for example electrical probes used for probing the sample. This makes the (expensive) manipulator useable for other uses as well.

In an aspect, a sample carrier for use in a SEM and/or a sample carrier for use in a FIB and/or a sample carrier for use in a TEM is equipped with a bundle of CNTs.

By equipping a sample carrier with a bundle of CNTs, a sample can be removably attached to the sample carrier.

In another aspect, a manipulator for use in a particle-optical apparatus, the manipulator having a tip with a bundle of CNTs to removably attach a sample thereto.

By equipping the manipulator with a bundle of CNTs, a sample can be removably attached to the manipulator.

In an embodiment, the tip of the manipulator is a replaceable tip.

This enables the use of the manipulator for several uses, such as repositioning a sample using a bundle of CNTs, probing a sample, using a manipulator to position gas nozzles as described in European patent application EP15156537, etc.

In yet another embodiment a charged particle apparatus is equipped with a movable stage, the stage for positioning a sample, the stage equipped with an area with one or more bundles or carbon nanotubes.

The invention is now elucidated using figures, in which identical reference numerals refer to corresponding features. To that end:

FIGS. 1A-1E schematically show a sample, at first attached to a manipulator, attached to a second substrate with CNTs.

Figure 2:
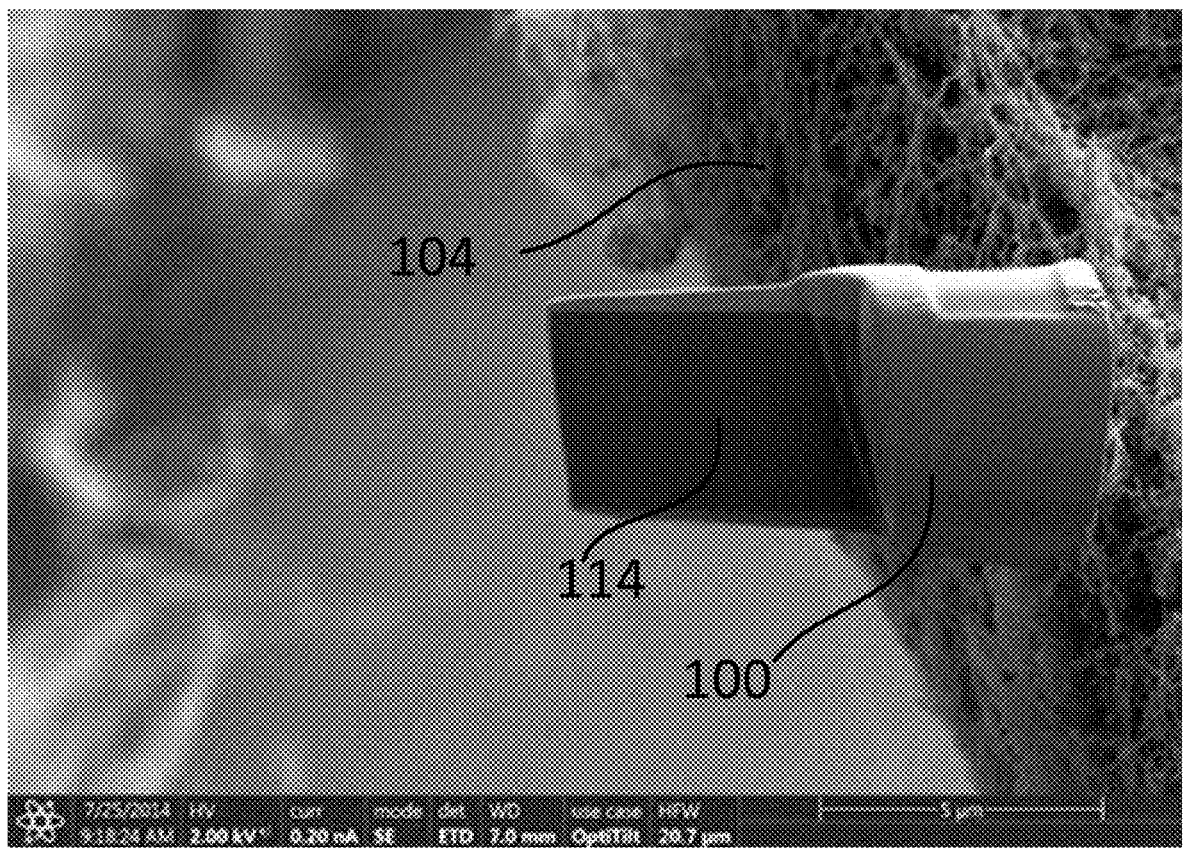

FIG. 2 shows a micrograph of a TEM lamella prepared on a second substrate (sample holder) with oriented CNTs.

FIGS. 3A-3E schematically show a sample excavated from a first substrate attached to a CNT area on a manipulator and then transporting the sample to a second surface.

FIGS. 1A-1E schematically show a sample, at first attached to a manipulator, attached to a second substrate with CNTs.

FIG. 1A schematically shows a sample 100 attached (connected, welded, soldered) to a tip 106 of a manipulator. The connection is made by Beam Induced Deposition (Electron Beam Induced Deposition, Ion Beam Induced Deposition, Laser Beam Induced Deposition) or a comparable technique resulting in a weld 108 welding the sample and the tip together. Also shown are the target areas, the bundle of CNTs 104 (also known as CNT functional area or short: CNT area) on a secondary substrate 102 (for example a part of a sample holder).

Figure 1B:
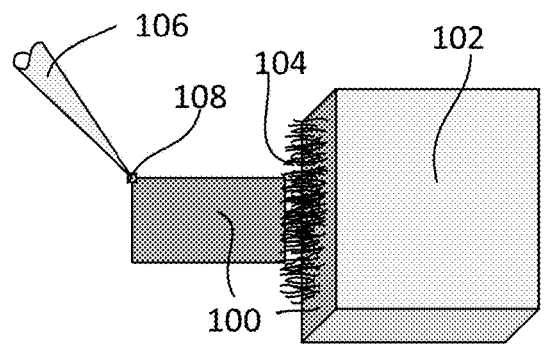

FIG. 1B schematically shows that the sample 100 is moved towards the CNT area until the sample is contacting the CNT area.

Figure 1C:
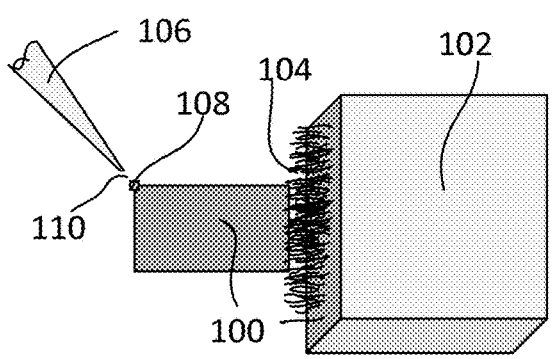

FIG. 1C schematically shows that the tip 106 of the manipulator is severed from the weld 108 and sample 100. This is typically done by ion beam milling, a method known as such.

Figure 1D:
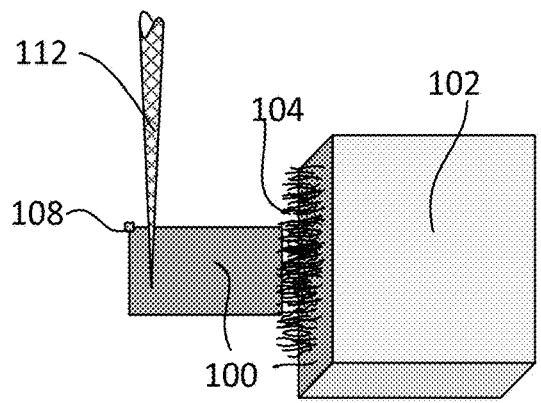

FIG. 1D schematically shows that the sample 100, attached to the CNT area 104, is irradiated by a focused beam of ions 112 for locally thinning the sample and removing the weld 108. It is noted that said focused ion beam can also be used make the separation between manipulator and weld shown in FIG. 10.

Figure 1E:
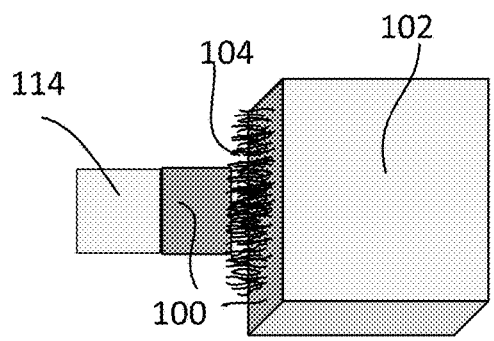

FIG. 1E shows that the sample 100 is locally thinned to a lamella 114 with a thickness of for example 100 nm or less. At such a thickness the sample shows transparence for electrons in a (Scanning) Transmission Electron Microscope, and can thus be inspected in a (S)TEM.

FIG. 2 shows a micrograph corresponding to FIG. 1E.

A TEM sample 100 was attached to an oriented carbon nanotubes functional area 104. The sample was then locally thinned to a lamella 114 with a thickness of approximately 100 nm. No welding (for example using IBID) was used to attach the sample to the CNT area 104. The mechanical adhesion was qualitatively tested: it proved to be comparable or better than classical IBID or EBID welding.

It is noted that in this example a weld was used to attach the sample to the manipulator. However, by using bundles of CNTs with different surface area, or different orientations, for example a small area on the manipulator and a large area on the second surface, it is possible to first attach the sample to a manipulator with CNTs and then attach the sample to a second substrate with CNTs, and detach the sample from the manipulator by pulling, keeping the binding between the sample and the (CNT area on the) second surface.

FIGS. 3A-3E schematically show a sample excavated from a first substrate attached to a CNT area on a manipulator and then transporting the sample to a second surface.

Figure 3A:
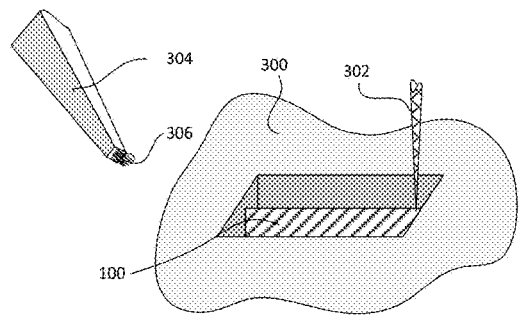

FIG. 3A schematically shows a first surface 300 (for example the surface of a semiconductor wafer) from which a sample 100 is excavated by a focused ion beam 302. A manipulator 304 with a CNT area 306 on its tip end is nearby.

Figure 3B:
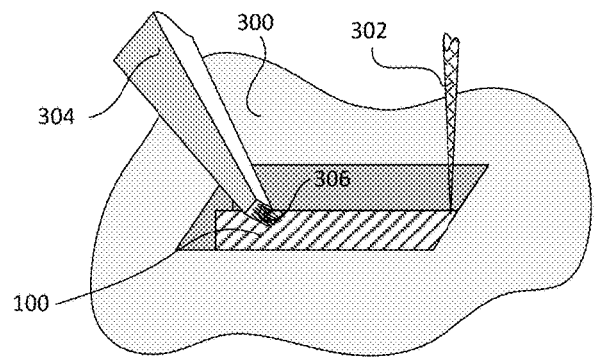

FIG. 3B schematically shows that, while excavating, the manipulator 304 with its CNT area 306 is brought into contact with the sample 100, as a result of which the sample is attached to the CNT area.

Figure 3C:
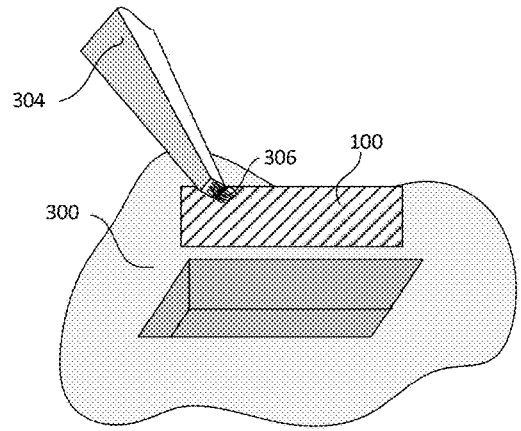

FIG. 3C schematically shows that the completely freed sample 100 is lifted from the first surface 300 by the manipulator 304 with its CNT area 306.

Figure 3D:
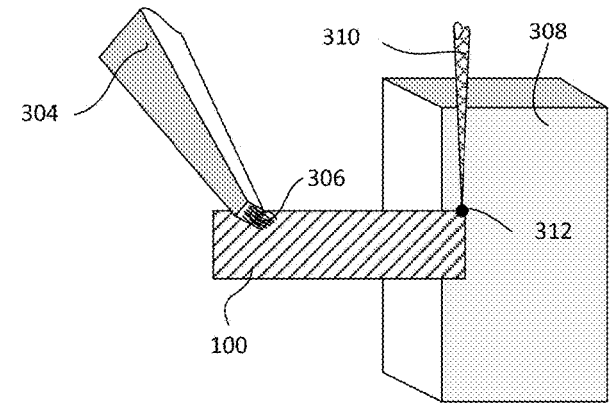

FIG. 3D schematically shows that the sample 100 is transported to a second surface 308 (for example a TEM sample grid) and held against the second surface. A focused ion beam 310 is used for IBID, forming a weld 312.

It is noted that the beam 310 can be the same beam as beam 302, but for milling (FIG. 3A) no or other gasses are used than for IBID (FIG. 3D).

Figure 3E:
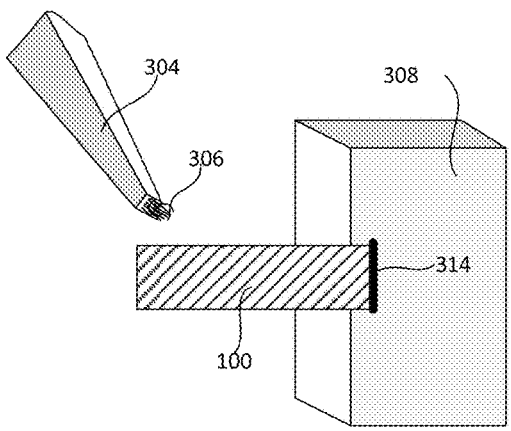

FIG. 3E shows that the weld 312 is enlarged into weld 314 and the manipulator 304 with its CNT functional area 306 is pulled from the sample 100.

By choosing the CNT surface area and CNT orientation it is possible to replace the welding steps shown in FIGS. 3D and 3E to attaching the sample to a CNT area on the second surface, as shown in FIGS. 1A-1E.

It is noted that after attaching the sample to the second surface, the sample can be thinned, for example in a charged particle apparatus equipped with a focused ion beam column, and then either be inspected in the same instrument (especially if such an instrument is also equipped with a scanning electron microscope column), or transported and inspected in a (S)TEM.

The use of a carbon nanotubes (CNT) function area thus results in a quick method for attaching/detaching a sample avoiding the risks of losing a sample when electrostatically gripped or the risks of mechanical deformation when using a mechanical gripper.

The invention claimed is:

1. A method of manipulating a sample in an evacuated chamber of a charged particle apparatus, the method performed in said evacuated chamber, the method comprising:
   providing a sample on a first substrate,
   bringing an extremal end of a manipulator in contact with the sample,
   attaching the sample to said extremal end, the attaching being a removable attaching,
   lifting the sample attached to the extremal end of the manipulator from the first substrate and transport the sample to a second substrate,
   attaching the sample to the second substrate, and
   detaching the sample from the extremal end of the manipulator,
   wherein at least one of the steps of attaching the sample is performed solely by bringing the sample into contact with a bundle of carbon nanotubes.

2. The method of claim 1 in which the other step of attaching the sample comprises attaching the sample by beam induced deposition from the group of EBID, IBID or LBID.

3. The method of claim 2 in which the sample is attached to the extremal end of the manipulator by EBID, IBID or LBID and attached to the second substrate solely by bringing the sample into contact with a bundle of carbon nanotubes.

4. The method of claim 1 in which the sample is a semiconductor sample, said sample excavated from the first substrate.

5. The method of claim 1 in which the second substrate is a sample carrier for use in a scanning electron microscope and/or a sample carrier for use in a focused ion beam apparatus and/or a sample carrier for use in a transmission electron microscope and/or a sample carrier for a scanning transmission electron microscope and/or a MEMS heater.

6. The method of claim 1 in which the second substrate is equipped with a bundle of carbon nanotubes and the step of attaching the sample to the second substrate is a step of removably attaching the sample to said bundle of carbon nanotubes.

7. The method of claim 1 in which the manipulator is equipped with a bundle of carbon nanotubes and the step of attaching the sample to the manipulator is a step of removably attaching the sample to said bundle of carbon nanotubes.

8. The method of claim 7 in which the bundle of carbon nanotubes is attached to the body of the manipulator by electron beam induced deposition, ion beam induced deposition, or laser beam induced deposition.

9. A manipulator for use in a charged particle apparatus, the manipulator having an extremal end equipped with a bundle of carbon nanotubes to transfer a sample from a first substrate to a second substrate, the bundle of carbon nanotubes equipped to removably attach the sample to the extremal end of the manipulator.

10. The manipulator of claim 9 in which the extremal end is a replaceable extremal end.

11. The method of claim 2 in which the sample is a semiconductor sample, said sample excavated from the first substrate.

12. The method of claim 3 in which the sample is a semiconductor sample, said sample excavated from the first substrate.

13. The method of claim 2, in which the second substrate is a sample carrier for use in a scanning electron microscope and/or a sample carrier for use in a focused ion beam apparatus and/or a sample carrier for use in a transmission electron microscope and/or a sample carrier for a scanning transmission electron microscope and/or a MEMS heater.

14. The method of claim 3, in which the second substrate is a sample carrier for use in a scanning electron microscope and/or a sample carrier for use in a focused ion beam apparatus and/or a sample carrier for use in a transmission electron microscope and/or a sample carrier for a scanning transmission electron microscope and/or a MEMS heater.

15. The method of claim 2, in which the second substrate is equipped with a bundle of carbon nanotubes and the step of attaching the sample to the second substrate is a step of removably attaching the sample to said bundle of carbon nanotubes.

16. The method of claim 3, in which the second substrate is equipped with a bundle of carbon nanotubes and the step of attaching the sample to the second substrate is a step of removably attaching the sample to said bundle of carbon nanotubes.

17. The method of claim 2, in which the manipulator is equipped with a bundle of carbon nanotubes and the step of attaching the sample to the manipulator is a step of removably attaching the sample to said bundle of carbon nanotubes.

18. The method of claim 3, in which the manipulator is equipped with a bundle of carbon nanotubes and the step of attaching the sample to the manipulator is a step of removably attaching the sample to said bundle of carbon nanotubes.

* * * * *